United States Patent
Furukawa et al.

(10) Patent No.: US 12,522,748 B2
(45) Date of Patent: *Jan. 13, 2026

(54) SLURRY, POLISHING METHOD, AND METHOD FOR PRODUCING SEMICONDUCTOR COMPONENT

(71) Applicant: Resonac Corporation, Tokyo (JP)

(72) Inventors: Satoshi Furukawa, Tokyo (JP); Tomohiro Iwano, Tokyo (JP); Shigeki Kubota, Tokyo (JP); Atsuko Ueda, Tokyo (JP); Koichi Kagesawa, Tokyo (JP)

(73) Assignee: Resonac Corporation, Tokyo (JP)

( * ) Notice: Subject to any disclaimer, the term of this patent is extended or adjusted under 35 U.S.C. 154(b) by 405 days.

This patent is subject to a terminal disclaimer.

(21) Appl. No.: 18/246,798

(22) PCT Filed: Sep. 15, 2021

(86) PCT No.: PCT/JP2021/033972
§ 371 (c)(1),
(2) Date: Mar. 27, 2023

(87) PCT Pub. No.: WO2022/070926
PCT Pub. Date: Apr. 7, 2022

(65) Prior Publication Data
US 2023/0357600 A1    Nov. 9, 2023

(30) Foreign Application Priority Data

Sep. 30, 2020 (WO) .................. PCT/JP2020/037172

(51) Int. Cl.
*C09G 1/02* (2006.01)
*B24B 37/04* (2012.01)
*C09K 3/14* (2006.01)
*H01L 21/3105* (2006.01)

(52) U.S. Cl.
CPC .............. *C09G 1/02* (2013.01); *B24B 37/044* (2013.01); *C09K 3/14* (2013.01); *H01L 21/31053* (2013.01)

(58) Field of Classification Search
None
See application file for complete search history.

(56) References Cited

U.S. PATENT DOCUMENTS

| | | | |
|---|---|---|---|
| 5,861,054 A * | 1/1999 | Miyashita | B24B 37/04 257/E21.258 |
| 2009/0311864 A1 * | 12/2009 | Yamada | H01L 21/31053 438/693 |
| 2016/0024351 A1 | 1/2016 | Yoshida et al. | |
| 2019/0080927 A1 * | 3/2019 | Izawa | H01L 21/3212 |
| 2020/0283659 A1 * | 9/2020 | Takahashi | C09G 1/02 |
| 2021/0054233 A1 * | 2/2021 | Matsumoto | C09K 3/1436 |

FOREIGN PATENT DOCUMENTS

| | | |
|---|---|---|
| CN | 110997856 A | 4/2020 |
| JP | H08-022970 A | 1/1996 |
| JP | H10-106994 A | 4/1998 |
| TW | 201610126 A | 3/2016 |
| TW | 201940617 A | 10/2019 |
| WO | 2016006553 A1 | 1/2016 |
| WO | 2016140968 A1 | 3/2016 |
| WO | 2019/181013 A1 | 9/2019 |
| WO | 2019/182061 A1 | 9/2019 |
| WO | 2019181016 A1 | 9/2019 |

* cited by examiner

*Primary Examiner* — Stephanie P Duclair
(74) *Attorney, Agent, or Firm* — Fitch, Even, Tabin & Flannery LLP

(57) ABSTRACT

A slurry containing: abrasive grains; a compound X having 3 or more carbon atoms; and water, in which the abrasive grains contain cerium oxide, and a dispersion term dD in Hansen solubility parameters of the compound X is 18.0 MPa$^{1/2}$ or less. A polishing method including polishing a surface to be polished by using this slurry.

18 Claims, No Drawings

SLURRY, POLISHING METHOD, AND METHOD FOR PRODUCING SEMICONDUCTOR COMPONENT

CROSS-REFERENCE TO RELATED APPLICATIONS

This application is a U.S. national phase application filed under 35 U.S.C. § 371 of International Application No. PCT/JP2021/033972, filed Sep. 15, 2021, designating the United States, which claims priority from International application No. PCT/JP2020/037172, filed Sep. 30, 2020, which are incorporated herein by reference in their entireties.

TECHNICAL FIELD

The present disclosure relates to a slurry, a polishing method, a method for manufacturing a semiconductor component, and the like.

BACKGROUND ART

In the manufacturing steps for semiconductor elements in recent years, the importance of processing technologies for density increase and micronization is increasing more and more. CMP (Chemical mechanical polishing) technology, which is one of the processing technologies, has become an essential technology for formation of a shallow trench isolation (STI), flattening of a pre-metal insulating material or an interlayer insulating material, formation of a plug or an embedded metal wiring, or the like in the manufacturing steps for semiconductor elements. As a CMP polishing liquid, a CMP polishing liquid that contains abrasive grains containing cerium oxide is known (see, for example, Patent Literatures 1 and 2 described below).

CITATION LIST

Patent Literature

Patent Literature 1: Japanese Unexamined Patent Publication No. H10-106994
Patent Literature 2: Japanese Unexamined Patent Publication No. H08-022970

SUMMARY OF INVENTION

Technical Problem

There is a case where a member containing silicon oxide is required to be polished and rapidly removed by using a CMP polishing liquid that contains abrasive grains containing cerium oxide. It is required for a slurry used as such a CMP polishing liquid to improve a polishing rate for silicon oxide.

An object of an aspect of the present disclosure is to provide a slurry capable of improving a polishing rate for silicon oxide. An object of another aspect of the present disclosure is to provide a polishing method using this slurry. An object of still another aspect of the present disclosure is to provide a method for manufacturing a semiconductor component using this polishing method.

Solution to Problem

An aspect of the present disclosure provides a slurry containing: abrasive grains; a compound X having 3 or more carbon atoms; and water, in which the abrasive grains contain cerium oxide, and a dispersion term dD in Hansen solubility parameters of the compound X is 18.0 MPa$^{1/2}$ or less.

Another aspect of the present disclosure provides a polishing method including polishing a surface to be polished by using the aforementioned slurry.

According to such a slurry and a polishing method, a polishing rate for silicon oxide can be improved.

Still another aspect of the present disclosure provides a method for manufacturing a semiconductor component, the method including individually dividing a member having a polished surface polished by the aforementioned polishing method to obtain a semiconductor component.

Advantageous Effects of Invention

According to an aspect of the present disclosure, it is possible to provide a slurry capable of improving a polishing rate for silicon oxide. According to another aspect of the present disclosure, it is possible to provide a polishing method using this slurry. According to still another aspect of the present disclosure, it is possible to provide a method for manufacturing a semiconductor component using this polishing method. According to still another aspect of the present disclosure, it is possible to provide use of a slurry to polishing of silicon oxide.

DESCRIPTION OF EMBODIMENTS

Hereinafter, embodiments of the present disclosure will be described. However, the present disclosure is not limited to the following embodiments.

In the present specification, a numerical range that has been indicated by use of "to" indicates the range that includes the numerical values which are described before and after "to", as the minimum value and the maximum value, respectively. "A or more" in the numerical range means A and a range of more than A. "A or less" in the numerical range means A and a range of less than A. In the numerical ranges that are described stepwise in the present specification, the upper limit value or the lower limit value of the numerical range of a certain stage can be arbitrarily combined with the upper limit value or the lower limit value of the numerical range of another stage. In the numerical ranges that are described in the present specification, the upper limit value or the lower limit value of the numerical range may be replaced with the value shown in Examples. "A or B" may include either one of A and B, and may also include both of A and B. Materials listed as examples in the present specification can be used singly or in combinations of two or more, unless otherwise specified. When a plurality of substances corresponding to each component exist in the composition, the content of each component in the composition means the total amount of the plurality of substances that exist in the composition, unless otherwise specified. A hydroxy group (hydroxyl group) does not include an OH group contained in a carboxy group. A dispersion term dD and a polarization term dP in Hansen solubility parameters described below have unit "MPa$^{1/2}$", and the notation of unit "MPa$^{1/2}$" is appropriately omitted hereinafter.

A slurry of the present embodiment contains abrasive grains, a compound X having 3 or more carbon atoms, and water, in which the abrasive grains contain cerium oxide, and a dispersion term dD in Hansen solubility parameters of the compound X is 18.0 MPa$^{1/2}$ or less. The slurry of the present embodiment can be used as a slurry for polishing (for example, a CMP polishing liquid).

According to the slurry of the present embodiment, the polishing rate for silicon oxide can be improved, and the polishing rate for silicon oxide of 5000 Å/min or more can be obtained. Furthermore, according to the slurry of the present embodiment, the polishing rate for silicon oxide derived from TEOS (tetraethoxysilane) (silicon oxide obtained by using TEOS; for example, silicon oxide of a TEOS film) can be improved. Although a factor responsible for improving the polishing rate for silicon oxide is not necessarily clear, the present inventor has speculated as described below. That is, when the dispersion term dD in Hansen solubility parameters of the compound X having 3 or more carbon atoms is small, since a relative influence of hydrogen bond or polarity is large, the compound X is likely to act on each of abrasive grains containing cerium oxide, and silicon oxide (for example, silicon oxide derived from TEOS). Therefore, a dehydration-condensation reaction between the abrasive grains and the silicon oxide is easy to proceed, so that the polishing rate for silicon oxide is improved. However, the factor is not limited to this content. According to the present embodiment, it is possible to provide a method for adjusting a polishing rate, the method including adjusting a polishing rate for silicon oxide on the basis of the dispersion term dD in Hansen solubility parameters.

The slurry of the present embodiment contains abrasive grains containing cerium oxide. In the present specification, the term "abrasive grains" means an aggregation of a plurality of particles, and for convenience, one particle constituting the abrasive grains may be referred to as an abrasive grain. The abrasive grains may include one or more types of particles. Examples of the constituent material for the abrasive grains other than the cerium oxide include inorganic substances such as silica, alumina, zirconia, titania, germania, and silicon carbide; and organic substances such as polystyrene, polyacrylic acid, and polyvinyl chloride.

The content of the cerium oxide in the abrasive grains may be more than 95% by mass, 98% by mass or more, 99% by mass or more, 99.5% by mass or more, or 99.9% by mass or more, on the basis of the whole abrasive grains (the whole abrasive grains contained in the slurry, or the whole one particle constituting the abrasive grains), from the viewpoint of easily improving the polishing rate for silicon oxide. The abrasive grains may be an embodiment substantially composed of cerium oxide (an embodiment in which substantially 100% by mass of the abrasive grains are cerium oxide).

The abrasive grains may be in a colloidal form, and may include, for example, colloidal ceria. The slurry containing colloidal abrasive grains is a suspension of abrasive grains, and has a state where cerium oxide forming the abrasive grains is dispersed in water. The colloidal abrasive grains can be obtained, for example, by a liquid phase method, and are abrasive grains derived from a liquid phase method. Examples of the liquid phase method include a colloid method, a hydrothermal synthesis method, a sol-gel method, a neutralization decomposition method, a hydrolysis method, a chemical precipitation method, a coprecipitation method, an atomizing method, a reverse-micelle method, and an emulsion method. The abrasive grains may have a crystal grain boundary and may not have a crystal grain boundary.

As the colloidal abrasive grains, abrasive grains in which $\tau^2$ among positron lifetimes $\tau1$ to $\tau4$ is 0.3650 ns or less can be used. Herein, the term "positron lifetime" is a time for which a positron released from $^{22}$Na is annihilated with an electron, and is used as a probe of ultrafine voids such as sub-nanometer to nanometer order lattice defects and free volume. That is, a shorter positron lifetime indicates higher denseness of particles.

In measurement of the positron lifetime, PAS Type L-II manufactured by TOYO SEIKO CO., LTD. can be used. Powder obtained by vacuum-drying abrasive grains at room temperature (25° C.) for 24 hours is placed in a powder measurement box, the powder measurement box is then set in a positron radiation source portion, and measurement is performed until the cumulated number reaches 1000000 counts. The lifetime histogram is separated into two components and analyzed by using IPALM that is software attached to the apparatus. Since some of positrons released from $^{22}$Na are annihilated by a positron radiation source itself such as Kapton or an adhesive, and the component thereof is mixed in the measurement result, analysis is performed with assumption that the ratio of Kapton is 30%. Among $\tau1$ to $\tau4$ of the obtained positron lifetimes, $\tau1$ and $\tau2$ correspond to a sample-derived positron lifetime, $\tau3$ corresponds to a Kapton-derived positron lifetime, and $\tau4$ corresponds to an adhesive-derived positron lifetime. Furthermore, $\tau1$ corresponds to a small void like a single pore, and $\tau2$ corresponds to a void in which a plurality of voids are clustered.

As the colloidal abrasive grains, abrasive grains in which a regular diffraction spot is observed in electron beam diffraction of a transmission electron microscope (TEM) can be used. For example, when colloidal ceria is used as the abrasive grains, in a diffraction spot obtained when an electron beam is applied vertically to a (111) plane of ceria, in a case where two diffraction spots A1 and A2 adjacent to each other and a diffraction spot B adjacent to the diffraction spots A1 and A2 are observed, abrasive grains, which have the diffraction spot B having a distance R between the diffraction spots (a distance between the diffraction spot A1 and the diffraction spot B and a distance between the diffraction spot A2 and the diffraction spot B) of 1.6 to 2.2 Å and having a minimum value of an angle α formed by the diffraction spots A1 and A2 using the diffraction spot B as a center of 58 to 62°, may account for 50% or more.

In the observation of the abrasive grains and the measurement of the distance R between the diffraction spots and the angle α, JEM-2100F manufactured by JEOL Ltd. can be used. In a TEM grid attached with the abrasive grains, one particle of the abrasive grains is subjected to electron beam diffraction under the conditions of an acceleration voltage of 200 kV, an electron beam wavelength of 2.508 pm, and a camera length of 30 cm, so that the distance R and the angle α can be measured. At least three or more of each of the distance R and the angle α are measured for one particle of the abrasive grains, and average values thereof can be adopted. The measurement is performed for all 100 or more abrasive grains which have been confirmed in one field of view at arbitrary magnification in TEM observation, and the ratio of the abrasive grains satisfying the aforementioned conditions can be calculated.

The average particle diameter of the abrasive grains may be in the below-mentioned range. The average particle diameter of the abrasive grains can be adjusted by spontaneous precipitation, a pulverization treatment, dispersion, filtration, or the like, and for example, the particle diameter adjustment may be performed after the constituent components of the slurry are mixed.

An average particle diameter D50 of the abrasive grains may be 1 nm or more, 3 nm or more, 5 nm or more, 10 nm or more, 30 nm or more, 50 nm or more, 80 nm or more, 100 nm or more, more than 100 nm, 120 nm or more, 130 nm or more, or 140 nm or more, from the viewpoint of easily improving the polishing rate for silicon oxide. The average particle diameter D50 of the abrasive grains may be 500 nm or less, 300 nm or less, 200 nm or less, 180 nm or less, 160 nm or less, 155 nm or less, 150 nm or less, or 148 nm or less, from the viewpoint of easily improving the polishing rate for silicon oxide. From these viewpoints, the average particle diameter D50 of the abrasive grains may be 1 to 500 nm. The average particle diameter D50 of the abrasive grains may be 142 nm or more, 144 nm or more, 145 nm or more, 146 nm or more, 147 nm or more, or 148 nm or more. The average particle diameter D50 of the abrasive grains may be 147 nm or less, 146 nm or less, 145 nm or less, 144 nm or less, 142 nm or less, or 140 nm or less. The average particle diameter D50 of the abrasive grains means 50% particle diameter in a volume-based cumulative distribution, and can be measured, for example, by a laser diffraction type particle size distribution analyzer.

A volume average particle diameter MV of the abrasive grains may be 1 nm or more, 3 nm or more, 5 nm or more, 10 nm or more, 30 nm or more, 50 nm or more, 80 nm or more, 100 nm or more, more than 100 nm, 120 nm or more, 130 nm or more, 140 nm or more, 145 nm or more, or 147 nm or more, from the viewpoint of easily improving the polishing rate for silicon oxide. The volume average particle diameter MV of the abrasive grains may be 500 nm or less, 300 nm or less, 200 nm or less, 180 nm or less, 160 nm or less, 155 nm or less, or 154 nm or less, from the viewpoint of easily improving the polishing rate for silicon oxide. From these viewpoints, the volume average particle diameter MV of the abrasive grains may be 1 to 500 nm. The volume average particle diameter MV of the abrasive grains may be 150 nm or more, 152 nm or more, 153 nm or more, or 154 nm or more. The volume average particle diameter MV of the abrasive grains may be 153 nm or less, 152 nm or less, 150 nm or less, or 147 nm or less. The volume average particle diameter MV of the abrasive grains can be measured, for example, by a laser diffraction type particle size distribution analyzer.

The content of the abrasive grains may be in the following range on the basis of the total mass of the slurry from the viewpoint of easily improving the polishing rate for silicon oxide. The content of the abrasive grains may be 0.01% by mass or more, 0.03% by mass or more, 0.05% by mass or more, 0.08% by mass or more, 0.10% by mass or more, 0.20% by mass or more, or 0.25% by mass or more. The content of the abrasive grains may be 10% by mass or less, 5.0% by mass or less, 3.0% by mass or less, 1.0% by mass or less, less than 1.0% by mass, 0.80% by mass or less, 0.50% by mass or less, less than 0.50% by mass, 0.40% by mass or less, 0.30% by mass or less, or 0.25% by mass or less. From these viewpoints, the content of the abrasive grains may be 0.01 to 10% by mass.

The slurry of the present embodiment contains a compound X having 3 or more carbon atoms and having a dispersion term dD (unit: MPa$^{1/2}$) in Hansen solubility parameters of 18.0 or less, from the viewpoint of improving the polishing rate for silicon oxide.

The number of carbon atoms of the compound X may be 4 or more from the viewpoint of easily improving the polishing rate for silicon oxide. The number of carbon atoms of the compound X may be 100 or less, 80 or less, 60 or less, 50 or less, 45 or less, 40 or less, or 35 or less, from the viewpoint of easily improving the polishing rate for silicon oxide. From these viewpoints, the number of carbon atoms of the compound X may be 3 to 100. The number of carbon atoms of the compound X may be 5 or more, 6 or more, 7 or more, 8 or more, 10 or more, 20 or more, 25 or more, 30 or more, 35 or more, or 40 or more. The number of carbon atoms of the compound X may be 30 or less, 25 or less, 20 or less, 10 or less, 8 or less, 7 or less, 6 or less, 5 or less, or 4 or less.

The Hansen solubility parameters (HSP) are values expressed as a coordinate of a three-dimensional space configured by the dispersion term dD (SD), the polarization term dP (dipole term, δP), and a hydrogen bond term dH (δH) that are three kinds of energy terms (unit: MPa$^{1/2}$) constituting the dispersed state of a substance. The Hansen solubility parameters of a compound can be calculated, for example, by using Hansen Solubility Parameters in Practice (HSPiP) program (ver. 5.3.02) on the basis of the structure of the compound.

The dispersion term dD of the compound X is 18.0 or less from the viewpoint of improving the polishing rate for silicon oxide. The dispersion term dD of the compound X may be less than 18.0, 17.9 or less, 17.8 or less, 17.7 or less, 17.6 or less, 17.5 or less, 17.3 or less, 17.2 or less, 17.0 or less, less than 17.0, 16.9 or less, 16.8 or less, 16.5 or less, 16.3 or less, or 16.1 or less, from the viewpoint of easily improving the polishing rate for silicon oxide. The dispersion term dD of the compound X may be 10.0 or more, more than 10.0, 12.0 or more, more than 12.0, 14.0 or more, more than 14.0, 15.0 or more, more than 15.0, 15.5 or more, 16.0 or more, or more than 16.0, from the viewpoint of easily improving the polishing rate for silicon oxide. From these viewpoints, the dispersion term dD of the compound X may be 10.0 to 18.0. The dispersion term dD of the compound X may be 16.0 or less, less than 16.0, or 15.5 or less. The dispersion term dD of the compound X may be 16.1 or more, 16.3 or more, 16.5 or more, 16.8 or more, 16.9 or more, 17.0 or more, more than 17.0, 17.2 or more, 17.3 or more, 17.5 or more, 17.6 or more, 17.7 or more, or 17.8 or more. The dispersion term dD tends to decrease, for example, as the number of a polar group (such as a hydroxy group and a carboxy group) in the compound X is large.

The polarization term dP may be in the following range from the viewpoint of adjusting the polishing rate for silicon oxide. The polarization term dP may be 0.1 or more, 0.5 or more, 1.0 or more, 3.0 or more, 5.0 or more, 7.0 or more, 9.0 or more, 9.2 or more, 9.4 or more, 9.5 or more, 9.7 or more, 10.0 or more, 10.1 or more, 10.2 or more, 10.3 or more, or 10.5 or more. The polarization term dP may be 30.0 or less, 20.0 or less, 15.0 or less, 12.0 or less, 11.0 or less, 10.5 or less, 10.3 or less, 10.2 or less, 10.1 or less, 10.0 or less, 9.7 or less, 9.5 or less, 9.4 or less, 9.2 or less, 9.0 or less, 7.0 or less, 5.0 or less, 3.0 or less, or 1.0 or less. From these viewpoints, the polarization term dP may be 0.1 to 30.0.

The molecular weight of the compound X may be in the following range from the viewpoint of adjusting the polishing rate for silicon oxide. The molecular weight of the compound X may be 50 or more, 80 or more, 100 or more, 105 or more, 110 or more, 120 or more, 121 or more, 125 or more, 130 or more, 140 or more, 150 or more, 200 or more, 300 or more, 500 or more, 700 or more, 800 or more, 1000 or more, or 1100 or more. The molecular weight of the compound X may be 3000 or less, 2000 or less, 1500 or less, 1200 or less, 1100 or less, 1000 or less, 800 or less, 700 or less, 500 or less, 300 or less, 200 or less, 150 or less, 140 or less, 130 or less, 125 or less, 121 or less, 120 or less, 110 or less, or 105 or less. From these viewpoints, the molecular weight of the compound X may be 50 to 3000. The molecular weight of the compound X may be, for example, a weight average molecular weight. The weight average molecular weight can be obtained, for example, by performing measurement by gel permeation chromatography (GPC) under the following conditions and converting in terms of polyethylene glycol/polyethylene oxide.

Equipment used (detector): "RID-IOA" differential refractometer for liquid chromatograph manufactured by SHIMADZU CORPORATION Pump: "RID-IOA" manufactured by SHIMADZU CORPORATION Degassing apparatus: "DGU-20A3R" manufactured by SHIMADZU CORPORATION Data processing: "LC solution" manufactured by SHIMADZU CORPORATION Column: "Gelpak GL-W530+Gelpak GL-W540" manufactured by Hitachi Chemical Techno Service Co., LTD., inner diameter 10.7 mm×300 mm Eluent: 50 mM-$Na_2HPO_4$ aqueous solution/acetonitrile=90/10 (v/v)

Measurement temperature: 40° C.

Flow rate: 1.0 mL/min

Measurement time: 60 minutes

Sample: Sample prepared by adjusting a concentration with a solution having the same composition as the eluent so that the resin component concentration becomes 0.2% by mass and filtering through a 0.45 μm membrane filter Injection amount: 100 μL Standard substance: Polyethylene glycol/polyethylene oxide manufactured by Tosoh Corporation The compound X may have at least one selected from the group consisting of a hydroxy group, a carboxy group, a carboxylate group, an amino group, and a thiol group, from the viewpoint of easily improving the polishing rate for silicon oxide. The compound X may not have at least one selected from the group consisting of a hydroxy group, a carboxy group, a carboxylate group, an amino group, and a thiol group.

The number of a hydroxy group in the compound X may be in the following range. The number of a hydroxy group may be 1 or more, 2 or more, 3 or more, 5 or more, 8 or more, or 10 or more, from the viewpoint of easily improving the polishing rate for silicon oxide. The number of a hydroxy group may be 30 or less, 25 or less, 20 or less, or 15 or less, from the viewpoint of easily improving the polishing rate for silicon oxide. From these viewpoints, the number of a hydroxy group may be 1 to 30. The number of a hydroxy group may be 12 or more, 15 or more, or 20 or more. The number of a hydroxy group may be 12 or less, 10 or less, 8 or less, 5 or less, 3 or less, or 2 or less.

In a case where the compound X has at least one selected from the group consisting of a carboxy group and a carboxylate group, the sum of the carboxy group and the carboxylate group in the compound X may be in the following range. The sum of the carboxy group and the carboxylate group may be 1 or more from the viewpoint of easily improving the polishing rate for silicon oxide. The sum of the carboxy group and the carboxylate group may be 5 or less, 4 or less, 3 or less, or 2 or less, from the viewpoint of easily improving the polishing rate for silicon oxide. From these viewpoints, the sum of the carboxy group and the carboxylate group may be 1 to 5.

The compound X may have a hydroxyalkyl group and may have a hydroxymethyl group, from the viewpoint of easily improving the polishing rate for silicon oxide. The number of a hydroxyalkyl group in the compound X may be 1, 2, or 3, from the viewpoint of easily improving the polishing rate for silicon oxide. The compound X may have a branched carbon chain and may have a quaternary carbon atom, from the viewpoint of easily improving the polishing rate for silicon oxide.

Examples of the compound X include a water-soluble polymer, a saturated carboxylic acid (excluding a compound corresponding to a water-soluble polymer), a thiol compound (a compound having a thiol group; excluding a compound corresponding to a water-soluble polymer or a saturated carboxylic acid), and a polyol (excluding a compound corresponding to a water-soluble polymer, a saturated carboxylic acid, or a thiol compound). The "water-soluble polymer" is defined as a polymer (for example, a compound having a molecular weight (weight average molecular weight) of 300 or more) which is dissolved in 100 g of water at 25° C. in an amount of 0.1 g or more. Examples of the water-soluble polymer include polysaccharides such as cyclodextrin (such as α-cyclodextrin, β-cyclodextrin, and γ-cyclodextrin); and glycerol-based polymers such as polyglycerol and a polyglycerol derivative. From the viewpoint of adjusting the polishing rate for silicon oxide, the weight average molecular weight of the glycerol-based polymer (such as polyglycerol) may be in each of the aforementioned ranges for the molecular weight of the compound X, and may be, for example, 500 to 1000. Examples of the saturated carboxylic acid include hydroxyisobutyric acid (such as 2-hydroxyisobutyric acid), 2,2-bis(hydroxymethyl)butyric acid, and 2,2-bis(hydroxymethyl)propionic acid. Examples of the thiol compound include cysteine (for example, L-cysteine). Examples of the polyol include trimethylolethane.

The compound X may contain at least one selected from the group consisting of cyclodextrin, a glycerol-based polymer (for example, polyglycerol), hydroxyisobutyric acid, 2,2-bis(hydroxymethyl)propionic acid, 2,2-bis(hydroxymethyl)butyric acid, cysteine, and trimethylolethane, from the viewpoint of easily improving the polishing rate for silicon oxide. The compound X may be an embodiment containing cyclodextrin, an embodiment containing polyglycerol, an embodiment containing hydroxyisobutyric acid, an embodiment containing 2,2-bis(hydroxymethyl)butyric acid, or an embodiment containing 2,2-bis(hydroxymethyl)propionic acid, from the viewpoint of easily improving the polishing rate for silicon oxide.

The content of the compound X may be in the following range on the basis of the total mass of the slurry. The content of the compound X may be 0.0010% by mass or more, 0.0030% by mass or more, 0.0050% by mass or more, 0.0070% by mass or more, 0.010% by mass or more, 0.015% by mass or more, 0.020% by mass or more, or 0.025% by mass or more, from the viewpoint of easily improving the polishing rate for silicon oxide. The content of the compound X may be 10% by mass or less, 5.0% by mass or less, 1.0% by mass or less, less than 1.0% by mass, 0.70% by mass or less, 0.50% by mass or less, less than 0.50% by mass, 0.40% by mass or less, less than 0.40% by mass, 0.30% by mass or less, 0.20% by mass or less, 0.10% by mass or less, less than 0.10% by mass, 0.070% by mass or less, 0.050% by mass or less, less than 0.050% by mass, 0.030% by mass or less, or 0.025% by mass or less, from the viewpoint of easily improving the polishing rate for silicon oxide. From these viewpoints, the content of the compound X may be 0.0010 to 10% by mass. The content of the compound X may be 0.030% by mass or more, 0.050% by mass or more, more than 0.050% by mass, 0.070% by mass or more, or 0.10% by mass or more, from the viewpoint of easily improving the polishing rate ratio of silicon oxide with respect to silicon nitride.

The content of the compound X may be in the following range with respect to 100 parts by mass of the abrasive grains. The content of the compound X may be 0.1 parts by mass or more, 0.5 parts by mass or more, 1 part by mass or more, more than 1 part by mass, 3 parts by mass or more, 5 parts by mass or more, 7 parts by mass or more, or 10 parts by mass or more, from the viewpoint of easily improving the polishing rate for silicon oxide. The content of the compound X may be 200 parts by mass or less, 150 parts by mass or less, 100 parts by mass or less, 70 parts by mass or less, 50 parts by mass or less, 40 parts by mass or less, less than 40 parts by mass, 30 parts by mass or less, 20 parts by mass or less, or 10 parts by mass or less, from the viewpoint of easily improving the polishing rate for silicon oxide. From these viewpoints, the content of the compound X may be 0.1 to 200 parts by mass. The content of the compound X may be more than 10 parts by mass, 20 parts by mass or more, 30 parts by mass or more, or 40 parts by mass or more, from the viewpoint of easily improving the polishing rate ratio of silicon oxide with respect to silicon nitride.

The slurry of the present embodiment contains water. Water may be contained as a residue excluding other constituent components from the slurry. The content of the water may be in the following range on the basis of the total mass of the slurry. The content of the water may be 90.000% by mass or more, 93.000% by mass or more, 95.000% by mass or more, 97.000% by mass or more, 99.000% by mass or more, 99.200% by mass or more, 99.400% by mass or more, 99.500% by mass or more, 99.600% by mass or more, or 99.700% by mass or more. The content of the water may be less than 100% by mass, 99.900% by mass or less, 99.800% by mass or less, or 99.700% by mass or less. From these viewpoints, the content of the water may be 90.000% by mass or more and less than 100% by mass.

The slurry of the present embodiment may contain a compound having an amide structure and a carboxyl group and may not contain a compound having an amide structure and a carboxyl group (the content of the compound having an amide structure and a carboxyl group may be substantially 0% by mass on the basis of the total mass of the slurry). Examples of the compound having an amide structure and a carboxyl group include carbamic acid, oxamic acid, malonamic acid, succinamic acid, glutaramic acid, adipamic acid, maleamic acid, fumaramic acid, phthalamic acid, isophthalamic acid, terephthalamic acid, asparagine, and glutamine. The content of the compound having an amide structure and a carboxyl group may be less than 0.01% by mass on the basis of the total mass of the slurry.

The slurry of the present embodiment may contain a chelating agent and may not contain a chelating agent (the content of the chelating agent may be substantially 0% by mass on the basis of the total mass of the slurry). Examples of the chelating agent include ethylenediamine tetraacetic acid, ethylenediamine tetra(methylene phosphonic acid), N-(2-hydroxyethyl)ethylenediamine triacetic acid, 1,3-propanediamine tetraacetic acid, diethylenetriamine pentaacetic acid, triethylenetetramine hexaacetic acid, 2-hydroxypropan-1,3-diamine tetraacetic acid, glycol ether diamine-N,N,N',N'-tetraacetic acid, (S,S)-ethylenediamine disuccinic acid, L-aspartic acid-N,N-diacetic acid, and dicarboxymethyl glutamic acid. The content of the chelating agent may be less than 0.02% by mass or less than 0.01% by mass on the basis of the total mass of the slurry.

The slurry of the present embodiment may contain alkylamine and may not contain alkylamine (the content of the alkylamine may be substantially 0% by mass on the basis of the total mass of the slurry). The content of the alkylamine may be less than 0.001% by mass on the basis of the total mass of the slurry.

The slurry of the present embodiment may contain monocarboxylic acid and may not contain monocarboxylic acid (the content of the monocarboxylic acid may be substantially 0% by mass on the basis of the total mass of the slurry). The content of the monocarboxylic acid may be less than 0.003% by mass or less than 0.001% by mass on the basis of the total mass of the slurry.

The slurry of the present embodiment may contain a non-ionic polymer and may not contain a non-ionic polymer (the content of the non-ionic polymer may be substantially 0% by mass on the basis of the total mass of the slurry). Examples of the non-ionic polymer include polyglycerol. The content of the non-ionic polymer may be less than 0.0002% by mass or less than 0.0001% by mass on the basis of the total mass of the slurry.

The slurry of the present embodiment may contain iodine and may not contain iodine (the content of the iodine may be substantially 0% by mass on the basis of the total mass of the slurry). The content of the iodine may be less than 0.1% by mass on the basis of the total mass of the slurry.

The slurry of the present embodiment may contain a protein and may not contain a protein (the content of the protein may be substantially 0% by mass on the basis of the total mass of the slurry). The content of the protein may be less than 0.0001% by mass on the basis of the total mass of the slurry.

The slurry of the present embodiment may contain polyamide and may not contain polyamide (the content of the polyamide may be substantially 0% by mass on the basis of the total mass of the slurry). The content of the polyamide may be less than 0.0001% by mass on the basis of the total mass of the slurry.

The slurry of the present embodiment may contain oligosaccharide and may not contain oligosaccharide (the content of the oligosaccharide may be substantially 0% by mass on the basis of the total mass of the slurry). The content of the oligosaccharide may be less than 0.10% by mass on the basis of the total mass of the slurry.

The slurry of the present embodiment may contain starch and may not contain starch (the content of the starch may be substantially 0% by mass on the basis of the total mass of the slurry). The content of the starch may be less than 0.01% by mass or less than 0.001% by mass on the basis of the total mass of the slurry.

The slurry of the present embodiment may not contain cyclodextrin (the content of the cyclodextrin may be substantially 0% by mass on the basis of the total mass of the slurry). The content of the cyclodextrin may be less than 0.01% by mass or less than 0.001% by mass on the basis of the total mass of the slurry.

The slurry of the present embodiment may not contain a hydroxy acid (for example, a hydroxy acid having one carboxy group and one to three hydroxy groups) (the content of the hydroxy acid may be substantially 0% by mass on the basis of the total mass of the slurry). The content of the hydroxy acid (for example, a hydroxy acid having one carboxy group and one to three hydroxy groups) may be less than 0.01% by mass on the basis of the total mass of the slurry.

The slurry of the present embodiment may not contain a polyol and may not a polyether polyol (the content of the polyol or the content of the polyether polyol may be substantially 0% by mass on the basis of the total mass of the slurry). The content of the polyol or the content of the polyether polyol may be 0.1% by mass or less, less than 0.05% by mass, or 0.010% by mass or less, on the basis of the total mass of the slurry. The slurry of the present embodiment may be an embodiment in which a polyol is not contained and a pH is in each range described below (for example, 3.0 or more).

The slurry of the present embodiment may contain a cationic compound and may not contain a cationic compound (the content of the cationic compound may be substantially 0% by mass on the basis of the total mass of the slurry). The cationic compound is a compound having a cationic group in the molecule. Examples of the cationic group include an amino group (a functional group in which a hydrogen atom is removed from ammonia, primary amine, or secondary amine), an ammonium group (primary, secondary, tertiary, or quaternary ammonium group), an imino group, and a cyano group. Examples of the cationic compound include lauryl trimethyl ammonium chloride, trimethyl-2-methacryloyloxyethyl ammonium chloride, and 3-(methacrylamino)propyl trimethyl ammonium chloride. The cationic compound may be a cationic compound having a weight average molecular weight of less than 1000, and the slurry of the present embodiment may not contain a cationic compound having a weight average molecular weight of less than 1000. The content of the cationic compound may be less than 0.0001% by mass on the basis of the total mass of the slurry.

The slurry of the present embodiment may not contain at least one selected from the group consisting of a hydroxy acid, a polyol (excluding a compound corresponding to a hydroxy acid), and a cationic compound having a weight average molecular weight of less than 1000 (excluding a compound corresponding to a hydroxy acid or a polyol) (the content of the at least one selected from the group consisting of a hydroxy acid, a polyol, and a cationic compound having a weight average molecular weight of less than 1000 may be substantially 0% by mass on the basis of the total mass of the slurry).

The slurry of the present embodiment may not contain a compound having a weight average molecular weight of 1000 or more and may not contain a compound having a weight average molecular weight of 3000 or more, as the compound X (the content of the compound (the compound X) having a weight average molecular weight of 1000 or more or the content of the compound (the compound X) having a weight average molecular weight of 3000 or more may be substantially 0% by mass on the basis of the total mass of the slurry). The slurry of the present embodiment may not contain a compound having a weight average molecular weight of 1000 or more and may not contain a compound having a weight average molecular weight of 3000 or more, other than the compound X (the content of the compound (a compound other than the compound X) having a weight average molecular weight of 1000 or more or the content of the compound (a compound other than the compound X) having a weight average molecular weight of 3000 or more may be substantially 0% by mass on the basis of the total mass of the slurry). The content of the compound (the compound X or the compound other than the compound X) having a weight average molecular weight of 1000 or more or the content of the compound (the compound X or the compound other than the compound X) having a weight average molecular weight of 3000 or more may be 0.1% by mass or less, less than 0.1% by mass, 0.01% by mass or less, less than 0.01% by mass, or 0.001% by mass or less, on the basis of the total mass of the slurry.

The slurry of the present embodiment may not contain a compound (for example, a compound having a weight average molecular weight of 3000 or more) having at least one selected from the group consisting of a hydroxy group and an amide group (the content of the compound may be substantially 0% by mass on the basis of the total mass of the slurry). The content of the compound (for example, a compound having a weight average molecular weight of 3000 or more) having at least one selected from the group consisting of a hydroxy group and an amide group may be 0.1% by mass or less, less than 0.1% by mass, 0.01% by mass or less, less than 0.01% by mass, or 0.001% by mass or less, on the basis of the total mass of the slurry.

The pH of the slurry of the present embodiment may be in the following range from the viewpoint of adjusting the polishing rate for silicon oxide. The pH of the slurry may be 1.0 or more, 2.0 or more, more than 2.0, more than 2.7, 2.8 or more, 3.0 or more, more than 3.0, 3.3 or more, 3.4 or more, 3.5 or more, 3.7 or more, 4.0 or more, more than 4.0, 4.5 or more, 4.6 or more, 4.8 or more, 5.0 or more, more than 5.0, 5.5 or more, or 5.6 or more. The pH of the slurry may be 12 or less, 10 or less, 8.0 or less, 7.0 or less, less than 7.0, 6.5 or less, 6.0 or less, less than 6.0, 5.6 or less, 5.5 or less, 5.0 or less, less than 5.0, 4.8 or less, 4.6 or less, 4.5 or less, 4.0 or less, less than 4.0, 3.7 or less, 3.5 or less, or 3.4 or less. From these viewpoints, the pH of the slurry may be 1.0 to 12, 2.0 to 7.0, or 3.0 to 6.0.

The pH of the slurry of the present embodiment can be measured with a pH meter (for example, Model No. PHL-40 manufactured by DKK-TOA CORPORATION). For example, the pH meter is subjected to two-point calibration by using a phthalate pH buffer solution (pH: 4.01) and a neutral phosphate pH buffer solution (pH: 6.86) as standard buffer solutions, subsequently the electrode of the pH meter is introduced into the slurry, and the value after being stabilized after a lapse of two minutes or longer is measured. At this time, both the liquid temperatures of the standard buffer solutions and the slurry are set to 25° C.

As a parameter provided in a dispersion liquid (a dispersion liquid of the abrasive grains) obtained by adjusting the content of the abrasive grains in the slurry of the present embodiment to 5.0% by mass, on the basis of a parameter Y (Rsp/S; unit: g/m$^2$) calculated by the following formula, the polishing rate ratio of silicon oxide with respect to silicon nitride (the polishing rate for silicon oxide/the polishing rate for silicon nitride) can be adjusted. When the polishing rate ratio of silicon oxide with respect to silicon nitride is improved, this is preferable in use application of selectively polishing (removing) silicon oxide with respect to silicon nitride. The parameter Y is a value at 25° C. The content of the abrasive grains in the slurry of the present embodiment can be adjusted by diluting or concentrating the slurry. For example, when a dispersion liquid A having a content of abrasive grains of 5.0% by mass is diluted two-fold (mixed with pure water in the same amount as that of the dispersion liquid A) and then heated (for example, heated at 40° C. for 14 hours), and the content of the abrasive grains is thereafter adjusted to 5.0% by mass by mixing pure water to prepare a dispersion liquid B, the same parameter Y may be obtained for the dispersion liquid A and the dispersion liquid B. The ratio of the content of another additive (a component other than the abrasive grains and water; for example, the compound X) with respect to the content of the abrasive grains in the dispersion liquid is similar to that of the slurry. In a case where the content of the abrasive grains in the slurry of the present embodiment is 5.0% by mass, this slurry can be used as a dispersion liquid. The content of the abrasive grains can be checked, for example, by ICP emission spectroscopic analysis.

$Y$=Rsp/Total surface area $S$ of the abrasive grains={(Inverse number of an NMR relaxation time of the dispersion liquid)/(Inverse number of an NMR relaxation time in a state where the abrasive grains are excluded from the dispersion liquid)−1}/Total surface area $S$ of the abrasive grains Rsp is an index of affinity (hydrophilicity) of the surface of the abrasive grains with respect to a solvent (water molecule). By dividing Rsp by the total surface area S of the abrasive grains, an influence due to the total surface area of the abrasive grains is excluded, so that the hydrophilicity of the surface of the abrasive grains can be evaluated. Rsp tends to increase, for example, as the ratio of the content of the additive (a component other than the abrasive grains and water; for example, the compound X) with respect to the content of the abrasive grains increases. From the viewpoint of securing sufficient measurement accuracy, it is recommended to measure Rsp in a state where the content of particles is a sufficient amount (for example, 1.2% by mass or more).

The NMR relaxation time can be obtained by pulsed NMR measurement and has unit "ms". The pulsed NMR measurement is a method of measuring a transverse relaxation time of hydrogen nucleus ($^1$H nucleus) and can be performed by using a pulsed NMR Particle Interface Characteristic Evaluation Apparatus (trade name: Acron Area) manufactured by Nihon Rufuto Co., Ltd. The relaxation time can be obtained by Carr Purcell Meiboom Gill method (CPMG method). The measurement temperature is 25° C.

The "NMR relaxation time in a state where the abrasive grains are excluded from the dispersion liquid" can be measured by preparing a liquid having a composition in which the abrasive grains are excluded from the dispersion liquid. Furthermore, the abrasive grains can be excluded by centrifugal separation of the dispersion liquid at a centrifugal acceleration of 4700 G for 30 minutes, and the supernatant solution obtained by this centrifugal separation can also be used in the measurement of the "NMR relaxation time in a state where the abrasive grains are excluded from the dispersion liquid". The unit of the total surface area S of the abrasive grains is "m$^2$/g", and a BET surface area can be used as the total surface area S of the abrasive grains.

In the dispersion liquid obtained by adjusting the content of the abrasive grains in the slurry of the present embodiment to 5.0% by mass, the parameter Y calculated by the aforementioned formula may be 0.110 g/m$^2$ or more, 0.115 g/m$^2$ or more, 0.120 g/m$^2$ or more, 0.125 g/m$^2$ or more, 0.130 g/m$^2$ or more, 0.135 g/m$^2$ or more, 0.140 g/m$^2$ or more, or 0.145 g/m$^2$ or more, from the viewpoint of easily improving the polishing rate ratio of silicon oxide with respect to silicon nitride. Although a factor responsible for improving the polishing rate ratio of silicon oxide with respect to silicon nitride is not necessarily clear, the present inventor has speculated as described below. That is, silicon nitride has hydrophobicity as compared to silicon oxide (for example, silicon oxide derived from TEOS). In this case, in a slurry providing a dispersion liquid having a large parameter Y and having high hydrophilicity, the abrasive grains are less likely to act on silicon nitride than silicon oxide, and the abrasive grains are more likely to act on silicon oxide than silicon nitride, so that the polishing rate ratio of silicon oxide with respect to silicon nitride is improved. However, the factor is not limited to this content.

The parameter Y may be 0.200 g/m$^2$ or less, 0.190 g/m$^2$ or less, 0.180 g/m$^2$ or less, 0.170 g/m$^2$ or less, 0.160 g/m$^2$ or less, 0.155 g/m$^2$ or less, or 0.150 g/m$^2$ or less, from the viewpoint of easily improving the polishing rate ratio of silicon oxide with respect to silicon nitride. From these viewpoints, the parameter Y may be 0.110 to 0.200 g/m$^2$ or 0.120 to 0.200 g/m$^2$. The parameter Y may be 0.150 g/m$^2$ or more, 0.155 g/m$^2$ or more, 0.160 g/m$^2$ or more, 0.170 g/m$^2$ or more, or 0.180 g/m$^2$ or more.

A polishing method of the present embodiment polishes a surface to be polished by using the slurry of the present embodiment. According to the polishing method of the present embodiment, the polishing rate for silicon oxide can be improved. The surface to be polished may contain silicon oxide and may contain silicon oxide derived from TEOS. A material to be polished having a surface to be polished may be a single material or a plurality of materials. The material to be polished may be in the form of a film (film to be polished), may be a silicon oxide film, and may be a TEOS film.

A method for manufacturing a component of the present embodiment includes an individually dividing step of individually dividing a member (a member to be polished; a base substrate) having a polished surface polished by the polishing method of the present embodiment. The individually dividing step may be, for example, a step of dicing a wafer (for example, a semiconductor wafer) having a polished surface polished by the polishing method of the present embodiment to obtain chips (for example, semiconductor chips). As an embodiment of the method for manufacturing a component of the present embodiment, a method for manufacturing a semiconductor component of the present embodiment includes a step of individually dividing a member (a member to be polished) having a polished surface polished by the polishing method of the present embodiment to obtain semiconductor components (for example, semiconductor chips). The method of manufacturing a component of the present embodiment may include a polishing step of polishing a surface to be polished of a member to be polished by the polishing method of the present embodiment before the individually dividing step. A component of the present embodiment is a component obtained by the method for manufacturing a component of the present embodiment, may be a semiconductor component, and may be a chip (for example, a semiconductor chip) or the like.

A method for manufacturing a joined body of the present embodiment includes a joining step of joining a surface to be joined of a polished member polished by the polishing method of the present embodiment or a surface to be joined of a component obtained by the method for manufacturing a component of the present embodiment (for example, a surface to be joined of a semiconductor component obtained by the method for manufacturing a semiconductor component of the present embodiment) with a surface to be joined of a body to be joined. The surface to be joined of the polished member or the surface to be joined of the component may be a polished surface polished by the polishing method of the present embodiment. The body to be joined that is joined with the polished member or the component may be a polished member polished by the polishing method of the present embodiment or a component obtained by the method for manufacturing a component of the present embodiment, and may be a body to be joined that is different from these polished member and component. In the joining step, in a case where the surface to be joined of the polished member or the component has a metal portion and the surface to be joined of the body to be joined has a metal portion, the metal portions may be brought into contact with each other. The metal portion may contain copper. A joined body of the present embodiment is a joined body obtained by the method of manufacturing a joined body of the present embodiment.

An electronic device of the present embodiment has at least one selected from the group consisting of the member (member to be polished) having a polished surface polished by the polishing method of the present embodiment, the component of the present embodiment, and the joined body of the present embodiment.

EXAMPLES

Hereinafter, the present disclosure will be specifically described on the basis of Examples; however, the present disclosure is not limited to these.
<Preparation of Slurry>

Examples 1 to 9 and Comparative Examples 1 to 10

An additive shown in Table 1 was added to a liquid containing colloidal ceria particles (manufactured by Solvay, trade name: Zenus (registered trademark) HC60, content of particles: 30% by mass). Thereafter, after water was added, the particle diameter adjustment was performed to obtain a slurry A containing 5.0% by mass of the colloidal ceria particles (abrasive grains) and the additive. The content of the additive in the slurry A was 2.0% by mass in Examples 1, 3, and 8 and 0.50% by mass in Examples 2, 4 to 7, and 9 and Comparative Examples 1 to 10.

As the additive, the following compounds were used.
Examples 1 and 2: β-Cyclodextrin (dD=15.4, dP=0.9)
Examples 3 and 4: Polyglycerol (manufactured by Daicel Corporation, trade name "PGL 10PSW", weight average molecular weight=759, dD=16.0, dP=10.5)
Example 5: 2-Hydroxyisobutyric acid (dD=16.9, dP=9.2)
Example 6: 2,2-Bis(hydroxymethyl)butyric acid (dD=17.3, dP=9.4)
Example 7: 2,2-Bis(hydroxymethyl)propionic acid (dD=17.7, dP=10.2)
Examples 8 and 9: Trimethylolethane (dD=17.9, dP=10.1)
Comparative Example 1: Acetic acid (dD=15.2)
Comparative Example 2: α-Thioglycerol (dD=18.6)
Comparative Example 3: 2-Pyridineethanol (dD=19.0)
Comparative Example 4: 2-Acetylpyridine (dD=19.2)
Comparative Example 5: 3-Hydroxypyridine (dD=19.3)
Comparative Example 6: 4-Hydroxypyridine (dD=19.3)
Comparative Example 7: Acetanilide (dD=19.4)
Comparative Example 8: Nicotinamide (dD=19.9)
Comparative Example 9: 4-Aminobenzoic acid (dD=20.3)
Comparative Example 10: Allantoin (dD=20.8)

The aforementioned dispersion term dD and polarization term dP in Hansen solubility parameters in each additive were calculated by Hansen Solubility Parameters in Practice (HSPiP) program (ver. 5.3.02). In the calculation of the polyglycerol, a linear decamer structure was used.

Comparative Example 11

Water was added to a liquid containing colloidal ceria particles (manufactured by Solvay, trade name: Zenus (registered trademark) HC60, content of particles: 30% by mass) and then particle diameter adjustment was performed, thereby obtaining a slurry A containing 5.0% by mass of the colloidal ceria particles (abrasive grains).
<Preparation of Polishing Liquid>

A slurry B (polishing liquid) containing 0.25% by mass of the colloidal ceria particles (abrasive grains) was prepared by adding water to the aforementioned slurry A. The slurry B of each of Examples 1 to 9 and Comparative Examples 1 to 10 further contained an additive of Table 1, and the content of the additive was 0.10% by mass in Examples 1, 3, and 8 and 0.025% by mass in Examples 2, 4 to 7, and 9 and Comparative Examples 1 to 10, on the basis of the total mass of the slurry B.
<Measurement of pH>

The pH of the slurry B was measured by using a pH meter (Model No.: PHL-40 manufactured by DKK-TOA CORPORATION). The pH meter was subjected to two-point calibration by using a phthalate pH buffer solution (pH: 4.01) and a neutral phosphate pH buffer solution (pH: 6.86) as standard buffer solutions, subsequently the electrode of the pH meter was introduced into the slurry B, and the value after being stabilized after a lapse of two minutes or longer was measured. The measurement results are shown in Table 1.
<Measurement of Average Particle Diameter>

The average particle diameter D50 and the volume average particle diameter MV of the colloidal ceria particles in the slurry B were determined by using "Microtrac MT3300EXII" manufactured by MicrotracBEL Corp. The measurement results are shown in Table 1.
<Measurement of Parameter Y>

The slurry A (content of abrasive grains: 5.0% by mass) of each of Examples was subjected to centrifugal separation at a centrifugal acceleration of 4700 G for 30 minutes to precipitate the abrasive grains, and then the supernatant was removed. Subsequently, vacuum drying was performed at room temperature (25° C.) for 24 hours to obtain abrasive grain powder, and then the abrasive grain powder was vacuum-dried at 100° C. for 1 hour. Thereafter, measurement was performed by a gas adsorption method using a nitrogen gas as an adsorptive medium, by using a BET specific surface area measurement apparatus (manufactured by Anton Paar GmbH, trade name: autosorb iQ). The total surface area S of the abrasive grains was obtained by performing analysis according to a multipoint BET method.

Next, the slurry A (content of abrasive grains: 5.0% by mass) was prepared as a measurement sample A. Furthermore, water was added to an additive of Table 1 to prepare a measurement sample B. The content of the additive in the measurement sample B was 2.0% by mass in Examples 1, 3, and 8 and 0.50% by mass in Examples 2, 4 to 7, and 9. The measurement sample B had a composition in a state where the abrasive grains were excluded from the measurement sample A. Next, for these measurement samples A and B, the NMR relaxation time (25° C.) was measured by using a pulsed NMR-type particle interface characteristic evaluation apparatus (manufactured by Nihon Rufuto Co., Ltd., trade name: Acron Area). Then, after Rsp was calculated on the basis of the following formula, the parameter Y (Rsp/S) was obtained by dividing Rsp by the total surface area S of the abrasive grains. The results are shown in Table 1.

$Y$=Rsp/Total surface area $S$ of the abrasive grains={ (Inverse number of an NMR relaxation time of the measurement sample $A$)/(Inverse number of an NMR relaxation time of the measurement sample B)-1}/Total surface area S of the abrasive grains <Polishing Evaluation>

In a polishing apparatus (manufactured by Applied Materials, Inc., trade name: Mirra3400), a base substrate having a film to be polished (a silicon oxide film (TEOS film) or a silicon nitride film (SiN film)) formed on a $200 mm silicon wafer was set on a holder for mounting a base substrate to which an adsorption pad was attached. The holder was placed on a platen to which a porous urethane resin pad was attached such that the film to be polished faced the pad. The base substrate was pressed against the pad at a polishing load of 20 kPa while supplying each slurry B mentioned above onto the pad at an amount supplied of 200 mL/min. At this time, polishing was performed for 1 min by rotating the platen at 78 $min^{-1}$ and the holder at 98 $min^{-1}$. The base substrate after polishing was thoroughly washed with pure water and then dried. A change in film thickness before and after polishing the film to be polished was measured by using a light interference type film thickness measuring apparatus to determine a polishing rate (TEOS RR and SiN RR; unit: Å/min). Furthermore, the polishing rate ratio of silicon oxide with respect to silicon nitride (TEOS RR/SiN RR) was calculated. The results are shown in Table 1.

excluded from the dispersion liquid)−1}/Total surface area S of the abrasive grains.

2. The slurry according to claim 1, wherein the abrasive grains are in a colloidal form.

3. The slurry according to claim 1, wherein a content of the cerium oxide is 99% by mass or more on the basis of the entire abrasive grains contained in the slurry.

4. The slurry according to claim 1, wherein the compound X contains cyclodextrin.

5. The slurry according to claim 1, wherein the compound X contains polyglycerol.

6. The slurry according to claim 5, wherein a weight average molecular weight of the polyglycerol is 500 to 1000.

7. The slurry according to claim 1, wherein the slurry does not comprise a polyol.

8. The slurry according to claim 1, wherein the compound X contains hydroxyisobutyric acid.

9. The slurry according to claim 1, wherein the compound X contains 2,2-bis(hydroxymethyl) butyric acid.

10. The slurry according to claim 1, wherein the compound X contains 2,2-bis(hydroxymethyl) propionic acid.

11. The slurry according to claim 1, wherein a content of the compound X is 0.50% by mass or less on the basis of the total mass of the slurry.

TABLE 1

| | Additive | | | | | | | | | Polishing rate ratio |
|---|---|---|---|---|---|---|---|---|---|---|
| | Type | dD [$MPa^{1/2}$] | Content [mass %] (Slurry B) | pH | D50 [nm] | MV [nm] | Y [$g/m^2$] | TEOS RR [Å/min] | SiN RR [Å/min] | (TEOS RR/ SiN RR) |
| Example 1 | β-Cyclodextrin | 15.4 | 0.10 | 4.6 | 142 | 150 | 0.114 | 5120 | 246 | 21 |
| Example 2 | | | 0.025 | 4.6 | 148 | 154 | 0.155 | 5420 | 288 | 19 |
| Example 3 | Polyglycerol | 16.0 | 0.10 | 4.5 | 144 | 152 | 0.101 | 5538 | 870 | 6.4 |
| Example 4 | | | 0.025 | 4.8 | 146 | 153 | 0.108 | 5846 | 976 | 6.0 |
| Example 5 | 2-Hydroxyisobutyric acid | 16.9 | 0.025 | 3.4 | 140 | 147 | 0.187 | 5274 | 20 | 264 |
| Example 6 | 2,2-Bis(hydroxymethyl)butyric acid | 17.3 | 0.025 | 3.7 | 145 | 152 | 0.149 | 5150 | 6 | 858 |
| Example 7 | 2,2-Bis(hydroxymethyl)propionic acid | 17.7 | 0.025 | 3.7 | 145 | 152 | 0.152 | 5136 | 14 | 367 |
| Example 8 | Trimethylolethane | 17.9 | 0.10 | 4.6 | 142 | 150 | 0.058 | 5052 | 718 | 7.0 |
| Example 9 | | | 0.025 | 4.7 | 147 | 152 | 0.096 | 5198 | 750 | 6.9 |
| Comparative Example 1 | Acetic acid | 15.2 | 0.025 | 3.6 | 146 | 152 | — | 4534 | — | — |
| Comparative Example 2 | α-Thioglycerol | 18.6 | 0.025 | 4.6 | 145 | 152 | — | 4826 | — | — |
| Comparative Example 3 | 2-Pyridineethanol | 19.0 | 0.025 | 6.8 | 142 | 149 | — | 4106 | — | — |
| Comparative Example 4 | 2-Acetylpyridine | 19.2 | 0.025 | 4.8 | 140 | 147 | — | 3758 | — | — |
| Comparative Example 5 | 3-Hydroxypyridine | 19.3 | 0.025 | 6.3 | 142 | 149 | — | 4286 | — | — |
| Comparative Example 6 | 4-Hydroxypyridine | 19.3 | 0.025 | 5.3 | 144 | 151 | — | 4076 | — | — |
| Comparative Example 7 | Acetanilide | 19.4 | 0.025 | 4.7 | 140 | 147 | — | 4442 | — | — |
| Comparative Example 8 | Nicotinamide | 19.9 | 0.025 | 6.0 | 143 | 150 | — | 4124 | — | — |
| Comparative Example 9 | 4-Aminobenzoic acid | 20.3 | 0.025 | 4.0 | 140 | 147 | — | 4558 | — | — |
| Comparative Example 10 | Allantoin | 20.8 | 0.025 | 4.8 | 143 | 150 | — | 4710 | — | — |
| Comparative Example 11 | Not used | — | — | 4.6 | 139 | 153 | — | 4480 | — | — |

The invention claimed is:

1. A slurry comprising: abrasive grains; a compound X having 3 or more carbon atoms; and water, wherein the abrasive grains contain cerium oxide, a dispersion term dD in Hansen solubility parameters of the compound X is 18.0 $MPa^{1/2}$ or less, and a parameter Y as calculated by the following formula in a dispersion liquid obtained by adjusting a content of the abrasive grains in the slurry to 5.0% by mass is 0.110 $g/m^2$ or more, Y={(Inverse number of an NMR relaxation time of the dispersion liquid)/(Inverse number of an NMR relaxation time in a state where the abrasive grains are 12. The slurry according to claim 1, wherein a pH is 3.0 to 6.0.

13. The slurry according to claim 1, wherein the compound X contains trimethylolethane.

14. The slurry according to claim 1, wherein a content of the compound X is 0.050% by mass or less on the basis of the total mass of the slurry.

15. A polishing method comprising polishing a surface to be polished by using the slurry according to claim 1.

16. The polishing method according to claim 15, wherein the surface to be polished contains silicon oxide.

17. A method for manufacturing a semiconductor component, the method comprising individually dividing a member having a polished surface polished by the polishing method according to claim 15 to obtain a semiconductor component.

18. A slurry comprising: abrasive grains; a compound X having 3 or more carbon atoms; and water, wherein
- the slurry does not comprise a polyol and a compound having a weight average molecular weight of 3000 or more and having at least one selected from the group consisting of a hydroxy group and an amide group,
- the abrasive grains contain cerium oxide, and
- a dispersion term dD in Hansen solubility parameters of the compound X is 18.0 $\text{MPa}^{1/2}$ or less.

* * * * *